(12) United States Patent
Greslehner-Nimmervoll et al.

(10) Patent No.: US 11,397,240 B2
(45) Date of Patent: Jul. 26, 2022

(54) RADAR DEVICE, MONITORING DEVICE, PHASE CONTROL CIRCUIT AND METHOD FOR MONITORING A SIGNAL PROCESSING CIRCUIT

(71) Applicant: Infineon Technologies AG, Neubiberg (DE)

(72) Inventors: Bernhard Greslehner-Nimmervoll, Hagenberg im Mühlkreis (AT); Bernhard Gstoettenbauer, Engerwitzdorf (AT); Lukas Heschl, Linz (AT); Evangelos Koutsouradis, Linz (AT); Alexander Onic, Linz (AT)

(73) Assignee: Infineon Technologies AG

( * ) Notice: Subject to any disclaimer, the term of this patent is extended or adjusted under 35 U.S.C. 154(b) by 322 days.

(21) Appl. No.: 16/554,066

(22) Filed: Aug. 28, 2019

(65) Prior Publication Data
US 2020/0072942 A1 Mar. 5, 2020

(30) Foreign Application Priority Data
Sep. 5, 2018 (DE) .......................... 102018121687.4

(51) Int. Cl.
*G01S 7/40* (2006.01)
*G01S 7/28* (2006.01)
(Continued)

(52) U.S. Cl.
CPC .............. *G01S 7/4004* (2013.01); *G01S 7/28* (2013.01); *G01S 13/28* (2013.01); *H03L 7/197* (2013.01)

(58) Field of Classification Search
CPC ...... G01S 7/032; G01S 13/342; G01S 13/343; G01S 13/931; G01S 7/4008; G01S 7/4017; G01S 7/4056; G01S 7/40; G01S 7/4004; G01S 7/28; G01S 13/28; G01S 7/406; G01S 7/35; H03L 7/1976; H03L 7/1974; H03L 7/18; H03L 7/099; H03L 7/095; H03L 7/193; H03L 7/06; H03L 7/087; H03L 7/091; H03L 7/085; H03L 2207/06;
(Continued)

(56) References Cited
U.S. PATENT DOCUMENTS 9,219,487 B1 12/2015 Stuhlberger et al.
9,344,271 B1 * 5/2016 Dusatko ................ H04L 7/0331
(Continued)

FOREIGN PATENT DOCUMENTS

DE 102015114328 A1 3/2016
DE 102017124343 A1 6/2018
DE 102017113730 A1 12/2018

*Primary Examiner* — Olumide Ajibade Akonai
(74) *Attorney, Agent, or Firm* — Design IP

(57) ABSTRACT

One example of a radar device includes a phase-locked loop for generating a radiofrequency signal. The phase-locked loop has a multi-modulus divider. The radar device furthermore comprises a delta-sigma modulator for generating a modulated signal for the multi-modulus divider, and a signal generator for generating an input signal for the delta-sigma modulator. The radar device has monitoring circuits, wherein a first monitoring circuit is configured to monitor a locked state of the phase-locked loop, a second monitoring circuit is configured to monitor the delta-sigma modulator, and a third monitoring circuit is configured to monitor the signal generator.

27 Claims, 5 Drawing Sheets

(51) Int. Cl.
*G01S 13/28* (2006.01)
*H03L 7/197* (2006.01)

(58) Field of Classification Search
CPC ............ H03L 7/08; H03L 7/191; H03M 1/12;
H03M 3/38; H03M 3/50; H03M 3/30;
H03M 1/1009; H03M 1/1023; H03M
3/458; G06F 1/022; H04L 27/12; H03C
3/0933; H03C 3/0991; H03C 3/0966
See application file for complete search history.

(56) References Cited

U.S. PATENT DOCUMENTS

| | | | |
|---|---|---|---|
| 9,559,704 B1* | 1/2017 | Wong | H03L 7/1974 |
| 10,320,402 B2 | 6/2019 | Stuhlberger et al. | |
| 10,348,310 B1* | 7/2019 | Megawer | H03L 7/1974 |
| 2014/0049947 A1* | 2/2014 | Lombard | A41D 19/0157 |
| | | | 362/106 |
| 2014/0055179 A1* | 2/2014 | Gong | H03L 7/104 |
| | | | 327/156 |
| 2016/0322979 A1* | 11/2016 | Upadhyaya | H03L 7/1974 |
| 2017/0045607 A1* | 2/2017 | Bharadwaj | H03L 7/06 |
| 2017/0141857 A1* | 5/2017 | Casagrande | H03F 3/245 |
| 2018/0138899 A1* | 5/2018 | Tee | H03L 7/23 |
| 2018/0372843 A1 | 12/2018 | Greslehner-Nimmervoll et al. | |
| 2019/0081772 A1* | 3/2019 | Gao | H04L 27/148 |
| 2019/0296749 A1* | 9/2019 | Yanagihara | H03L 7/101 |
| 2019/0377034 A1* | 12/2019 | Kimball | H03M 3/42 |

* cited by examiner

RADAR DEVICE, MONITORING DEVICE, PHASE CONTROL CIRCUIT AND METHOD FOR MONITORING A SIGNAL PROCESSING CIRCUIT

FIELD

Exemplary embodiments of the disclosure deal with a radar device. Further exemplary embodiments relate to a monitoring device, a phase control circuit, a radar sensor and a method for monitoring a signal processing circuit.

BACKGROUND

For safety-relevant fields of application in electronics, for example automotive electronics, it may be necessary to monitor the functional safety of the electronic circuits or devices that are used. By way of example, it is necessary to comply with standard specifications in order to guarantee a function of the electronic devices.

Such an electronic device may be a radar system, for instance a frequency-modulated continuous-wave radar sensor (FMCW radar sensor). By way of example, the radar signal may be generated on a signal processing path upstream of the radar antenna, errors potentially being able to occur. In the event of an error, the result of a radar measurement may be incorrect. To detect incorrect radar measurements, failures of the radar system should be able to be detected.

There is a requirement for concepts for improved monitoring of a correct functionality of a signal path in electronic devices.

SUMMARY

One example deals with a radar device. The radar device includes a phase-locked loop for generating a radiofrequency signal. The phase-locked loop has a multi-modulus divider. The radar device furthermore includes a delta-sigma modulator for generating a modulated signal for the multi-modulus divider, and a signal generator for generating an input signal for the delta-sigma modulator. The radar device has a first monitoring circuit for monitoring a locked state of the phase-locked loop. The radar device furthermore has a second monitoring circuit for monitoring the delta-sigma modulator and a third monitoring circuit for monitor-ing the signal generator.

One example deals with a monitoring device for monitoring a functionality of a signal processing circuit. The monitoring device includes a first signal input that is designed to receive an output signal of a signal generator. The monitoring device furthermore includes a second signal input that is designed to receive a modulated signal generated using a delta-sigma modulator in the signal processing circuit. The modulated signal is based on the out-put signal of the signal generator. The monitoring device has a comparison circuit that is de-signed to monitor correct signal generation of the signal processing circuit based on the out-put signal of the signal generator and the modulated signal.

One example relates to a phase control circuit. The phase control circuit includes a signal generator, a signal processing circuit and a monitoring device. A signal output of the signal generator is connected to a first signal input of the monitoring device and to an input of the signal processing circuit. A signal output of the signal processing circuit is connected to a second signal input of the monitoring device. The monitoring device is designed to monitor a functionality of the signal processing circuit.

One example relates to a radar sensor. The radar sensor includes a controllable oscillator and a phase control circuit for controlling a frequency generation of a radar signal by way of the oscillator.

One example relates to a method for monitoring a signal processing circuit. The method includes forming a first value based on a control signal in order to set a frequency of a control loop of an oscillator. The method furthermore includes processing the control signal in a delta-sigma modulator in order to generate a modulated signal, and forming a second value based on the modulated signal. According to the method, the first value associated with the control signal is compared with the second value associated with the modulated signal in order to monitor the signal processing circuit.

BRIEF DESCRIPTION OF THE DRAWINGS

A few examples of devices and/or methods are explained in more detail below merely by way of example with reference to the appended figures. In the figures.

DETAILED DESCRIPTION

Various examples will now be described in more detail with reference to the appended figures, in which a number of examples are illustrated. In the figures, the thicknesses of lines, layers and/or regions may be exaggerated for clarification.

Further examples are suitable for different modifications and alternative forms, and consequently a few specific examples thereof are shown in the figures and will be described in detail below. However, this detailed description does not limit further examples to the described specific forms. Further examples may cover all modifications, correspondences and alternatives that fall within the scope of the disclosure. The same or similar reference signs relate throughout the description of the figures to the same or similar elements, which upon comparison with one another may be implemented identically or in a modified form, while providing the same or a similar function.

It is to be understood that where an element is referred to as being "connected" or "coupled" to another element, the elements may be connected or coupled directly or via one or more intermediate elements. When two elements A and B are combined using an "or," this is to be understood to mean that all possible combinations are disclosed, i.e. only A, only B, and also A and B, unless explicitly or implicitly defined otherwise. An alternative wording for the same combinations is "at least one of A and B" or "A and/or B". The same applies, mutatis mutandis, to combinations of more than two elements.

The terms used here to describe specific examples are not intended to be limiting for further examples. If a singular form, e.g. "a, an" and "the", is used and the use only of a single element is defined as being neither explicitly nor implicitly binding, further examples may also use plural elements to implement the same function. When a function is described below as being implemented using a plurality of elements, further examples may implement the same function using a single element or a single processing entity. Furthermore, it is understood that the terms "comprises," "comprising," "has" and/or "having" when used concretize the presence of the indicated features, whole numbers, steps, operations, processes, elements, components and/or a group thereof, but do not exclude the presence or the addition of one or more further features, whole numbers, steps, operations, processes, elements, components and/or a group thereof.

Unless this is otherwise defined, all terms (including technical and scientific terms) are used here in their typical meaning in the field to which examples belong.

Figure 1:
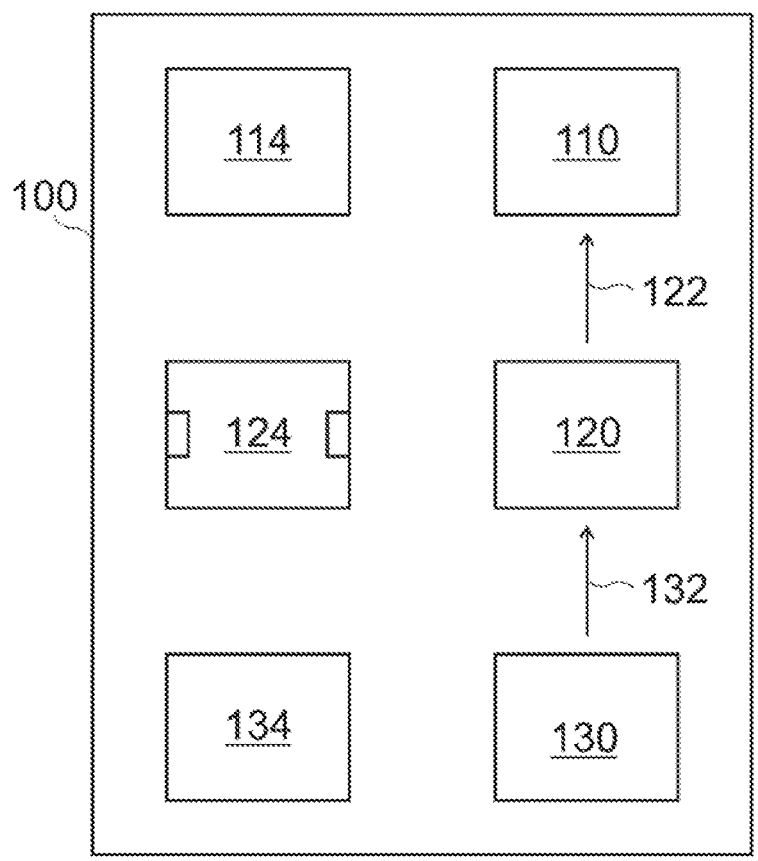
FIG. 1 shows a schematic block circuit diagram of a radar device.

FIG. 1 shows a block circuit diagram of a radar device 100. The radar device 100 comprises a phase-locked loop 110 for generating a radiofrequency signal. The phase-locked loop 110 has a multi-modulus divider. The radar device 100 furthermore comprises a delta-sigma modulator 120 for generating a modulated signal 122 for the multi-modulus divider. Delta-sigma modulators are sometimes also referred to in the literature as sigma-delta modulators. The radar device comprises a signal generator 130 for generating an input signal 132 for the delta-sigma modulator 120.

The radar device 100 furthermore has various monitoring devices or monitoring circuits. A first monitoring circuit 114 of the radar device 100 is designed to monitor a locked state of the phase-locked loop 110. A second monitoring circuit 124 of the radar device 100 is designed to monitor the delta-sigma modulator 120. A third monitoring circuit 134 of the radar device 100 is designed to monitor the signal generator 130.

Various respective circuit areas of the radar device 100, which for example perform various functions in the generation of a radar signal, may be monitored by way of the various monitoring circuits 114, 124, 134. The monitoring may for example detect errors that occur in the respective circuit areas. It is thereby possible to provide information both about the fact that the radar device 100 is possibly not operating correctly and about which part of the radar device has failed. The monitoring may increase the functional safety of the radar device 100, since various potential error sources are able to be monitored separately. By way of the separate monitoring devices, it is possible for instance to specifically identify error sources that could lead to an incorrect frequency of a radar signal of the radar device 100.

By way of example, different monitoring methods may in each case be implemented in the different monitoring circuits 114, 124, 134, by way of which monitoring methods the different functions of the circuit areas associated with the monitoring circuits are able to be monitored.

The first monitoring circuit 114 is for example designed to output first information that indicates an out-of-lock state of the phase-locked loop. To this end, for example, a phase of a signal of a feedback path of the phase-locked loop may be compared with a phase of a reference signal. The first information may then be output if the phases do not match. The first monitoring circuit may comprise a phase detector that outputs a corresponding error signal in the case of an out-of-lock state.

By way of example, the first monitoring device to this end comprises a first counter that is designed to count output signals of the multi-modulus divider, and a second counter that is designed to count output signals of a reference clock. The first monitoring device may be designed to compare the respective count values, for example in order to check the locked state of the phase-locked loop.

The second monitoring circuit 124 is designed to check whether the delta-sigma modulator 120 generates a correctly modulated signal 122 based on the input signal 132 received thereby. The second monitoring circuit 124 may be designed for example to output second information that indicates an incorrect behavior of the delta-sigma modulator 120. In the case of a behavior deviating from a setpoint behavior, an error information signal containing the second information may be output, for instance. It may for example be detected in the output error information signal that a radar signal of the radar device 100 possibly has an incorrect frequency. In the case of an incorrect function of the delta-sigma modulator, only a slight deviation of the frequency of the radar signal from a setpoint frequency may occur, for example, which deviation may cause a measurement error of the radar device, which would however not be able to be detected e.g. without the second monitoring circuit. The second monitoring circuit 124 may thus enable improved monitoring of the functionality of the radar device 100, since it is additionally able to provide monitoring of the functionality of the delta-sigma modulator.

As an alternative or in addition, a function information signal that indicates the correct function of the delta-sigma modulator 120 may be output by the second monitoring circuit 124 when a correct function of the delta-sigma modulator 120 is detected. A correct functionality of the delta-sigma modulator 120 may correspond for instance to a correct generation of a modulated signal by the delta-sigma modulator. Information may be continuously output e.g. by the function information signal when the delta-sigma modulator is functioning correctly.

The second monitoring circuit 124 may be designed to use a comparison between an input signal and an output signal of the delta-sigma modulator to monitor the delta-sigma modulator. The input signal may in this case comprise one or more signals (e.g. digital words) that represent rational numbers and the output signal may comprise a sequence of signals that comprise whole numbers (natural numbers). By way of example, the output signal may comprise a higher sampling rate than the input signal in order on average to represent signal values of the input signal, which are given by rational numbers, through a sequence of whole numbers of the output signal. In other words, the output signal may be described as a discrete representation of the input signal. Over a particular time range, in the case of a correct state of the delta-sigma modulator, for instance an average value and/or an accumulated value of the output signal are therefore identical or at least similar to the corresponding average value and/or accumulated value of the input signal. The error signal containing the second information may be output for instance when the values of the output signal deviate from the values of the input signal by more than a predefined tolerance value.

The third monitoring circuit 134 may be designed to output third information that indicates an incorrect behavior of the signal generator 130. The third monitoring circuit may be designed to use hash values, e.g. test values, that are associated with the expected output signal of the signal generator 130, to monitor the signal generator. By way of example, a correct functionality of the radar device 100 may be restricted even in the event of correct functionality of the delta-sigma modulator if the signal generator 130 is not functioning correctly.

The respective monitoring devices are designed for example to output a respective error information signal in the case of an incorrect functionality of the respectively monitored device, for example via a common signal output of the radar device 100. The respective error information signals may accordingly comprise the first, second and/or third information.

By virtue of the three provided monitoring devices, in cases in which in each case a correct functionality of the monitored components is indicated and an error still occurs in the output radar signal, in a search for an error within the radar device, an incorrect function of the respective components is able to be ruled out. The provision of the three different monitoring devices may thereby for example simplify a search for an error.

Figure 2:
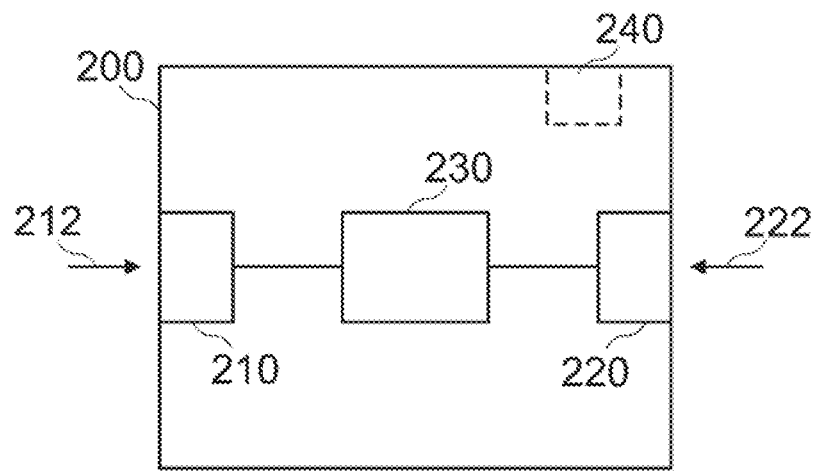
FIG. 2 shows a schematic block circuit diagram of a monitoring device.

FIG. 2 shows a block circuit diagram of a monitoring device 200. The monitoring device 200 may be used for instance as a second monitoring device of the radar device 100. The monitoring device 200 is designed to monitor a functionality of a signal processing circuit and comprises a first signal input 210 and a second signal input 220. The first signal input 210 is designed to receive an output signal 212 of a signal generator. The second signal input 220 is designed to receive a modulated signal 222 generated using a delta-sigma modulator in the signal processing circuit. In this case, the modulated signal 222 is based on the output signal 212 of the signal generator.

The monitoring device 200 furthermore has a comparison circuit 230 that is designed to monitor a correct signal generation or functionality of the signal processing circuit based on the output signal 212 of the signal generator and the modulated signal 222. In this case, a functionality of the signal processing circuit may comprise a correct generation of modulated signals by the signal processing circuit, for instance by a delta-sigma modulator.

The comparison circuit 230 may be designed to form a comparison value for monitoring the signal processing circuit based on data that were received by the first signal input 210 and based on data that were received by the second signal input 220. The comparison value may be formed based on a combination of the values of the respective data. In this case, e.g. values of a predefined time period or interval of the respective signal may be used, wherein the time periods of the data received via the first and second signal input correspond to one another. For example, signal values of the two input signals of the monitoring device may each be accumulated over a predetermined time, and the two accumulated values may be compared. As an alternative or in addition, for instance, a respective average value based on the respective signal values during the predetermined time may be created and the two average values may be compared with one another. The comparison may be based on a division and/or subtraction of the values to be compared. When comparing the values, various data rates of the input and output signal of the signal processing circuit may be taken into consideration in order to enable a comparison.

By way of example, the signal processing circuit may comprise a delta-sigma modulator having a MASH (multi-stage noise shaper). The MASH may bring about quasi-random values of the modulated signal due to internal feedback. Since, in the case of correct functionality, the values of the output signal of the delta-sigma modulator however correspond on average to the values of the input signal of the delta-sigma modulator, it is still possible to monitor the delta-sigma modulator by taking into consideration a time period of the two signals. Monitoring of a delta-sigma modulator having a noise shaper is thus also able to be provided by way of the comparison circuit, which would otherwise e.g. not be possible.

The monitoring device 200 may furthermore comprise a signal output 240. The monitoring device is designed e.g. to output an error information signal via the signal output 240 if the comparison value lies outside of a predetermined tolerance range. The predetermined tolerance range may be dependent on a circuit structure of the signal processing circuit. By way of example, in the case that the signal processing circuit is a delta-sigma modulator, the permissible deviation between the compared values may be dependent on an order or a number of modulation stages of the delta-sigma modulator. The predetermined tolerance range may furthermore be dependent on the length of the time interval under consideration from which values are used to form the comparison value. The error information signal may indicate an incorrect function of the monitored signal processing circuit. In other words, if the values of the data received by the first signal input 210 deviate too greatly from the values of the data received by the second signal input 220, and therefore an excessively large comparison value is detected, an incorrect function of the signal processing circuit may be indicated by the error information signal.

The output signal of the signal generator may be for example a sequence of digital signals for controlling a frequency ramp. By way of example, the values of the output signal are ramp-shaped themselves. The sequence of digital signals may comprise successively incremented rational numbers. In one embodiment, the signal generator may be implemented as a digital counter. The frequency ramp may correspond to a frequency sweep, for example of a radar signal.

The monitoring device may be designed to form the comparison value based on values of the sequence of digital signals in order to control the frequency ramp within a time interval between a first digital signal, which determines a beginning of the frequency ramp, and a second digital signal, which determines an end of the frequency ramp. To form the comparison value, values of the modulated signal (in other words, of the output signal of the delta-sigma modulator, e.g. of the signal 122 or of the signal 222) from a time interval corresponding to this time interval may accordingly be used. As an alternative, the comparison value may also be formed based on values from subsections of the time interval. It may thereby be possible to provide function monitoring for example as early as during a frequency sweep of the radar signal.

The sequence of digital signals of the output signal of the signal generator may comprise rational numbers. The signal modulated by the signal processing circuit may by contrast comprise a sequence of natural numbers. By way of example, the modulated signal is designed as input signal for a multi-modulus divider of a phase-locked loop of a radar sensor. A modulation range of the signal processing circuit (e.g. of a delta-sigma modulator) may for example comprise values that make it possible to generate a frequency-modulated radar signal having a rational center frequency (e.g.

77.5 GHz). A center frequency of 76.8 GHz is able to be achieved for example with an whole-number divider value 12.

Further details and aspects are described in connection with examples explained further above or further below. The examples shown in FIG. 2 may have one or more optional additional features that correspond to one or more aspects that are described in connection with the proposed concept or one or more examples further above or further below (for example in connection with FIG. 1 or FIG. 3-7).

Figure 3:
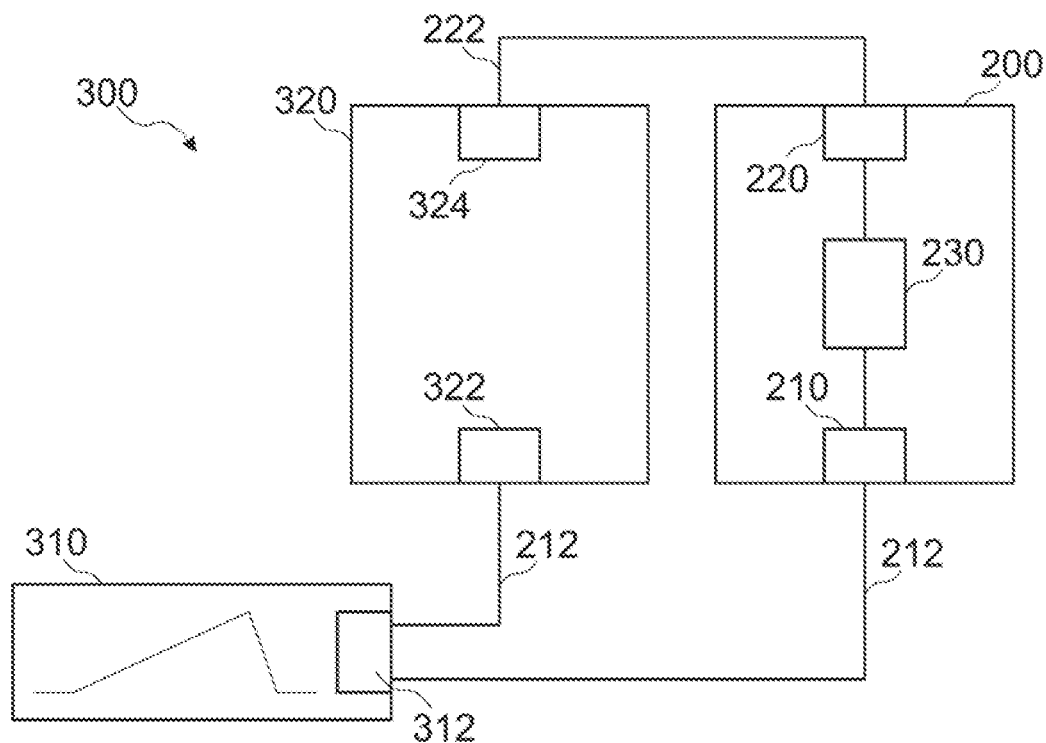
FIG. 3 shows a schematic block circuit diagram of a phase control circuit.

FIG. 3 shows a block circuit diagram of a phase control circuit 300. The phase control circuit 300 comprises a signal generator 310, a signal processing circuit 320 and a monitoring device 200 in accordance with a monitoring device described above or below. A signal output 312 of the signal generator 310 is connected to a first signal input 210 of the monitoring device 200 and to an input 322 of the signal processing circuit 320. A signal output 324 of the signal processing circuit 320 is connected to a second signal input 220 of the monitoring device 200. The monitoring device 200 is furthermore designed to monitor a functionality of the signal processing circuit 320. The signal processing circuit 320 comprises for example a delta-sigma modulator. The phase control circuit may be designed to generate a radiofrequency signal.

One example relates to a supervision circuit of the phase control circuit 300. The supervision circuit is designed to monitor an integrity of a sequence of digital signals of the signal generator 310 in order to control a frequency ramp based on test values created using the sequence of digital signals, and/or to monitor a phase of an output signal of the multi-modulus divider of the phase control circuit 300. By way of example, the supervision circuit comprises a lock detector for this purpose. In other words, the supervision circuit may comprise a previously described first and/or third monitoring device for monitoring a radar device.

One example relates to a radar sensor comprising a controllable oscillator and a phase control circuit in accordance with a phase control circuit described above or below, which is designed to control a frequency generation of a radar signal by way of the oscillator. By way of example, the multi-modulus divider of the phase control circuit is arranged in a feedback path of the controllable oscillator. The signal processing circuit having the monitoring device may by contrast be arranged outside of the feedback path.

Further details and aspects are described in connection with examples explained further above or further below. The examples shown in FIG. 3 may have one or more optional additional features that correspond to one or more aspects that are described in connection with the proposed concept or one or more examples further above or further below (for example in connection with FIGS. 1-2 or FIGS. 4-7).

Figure 4:
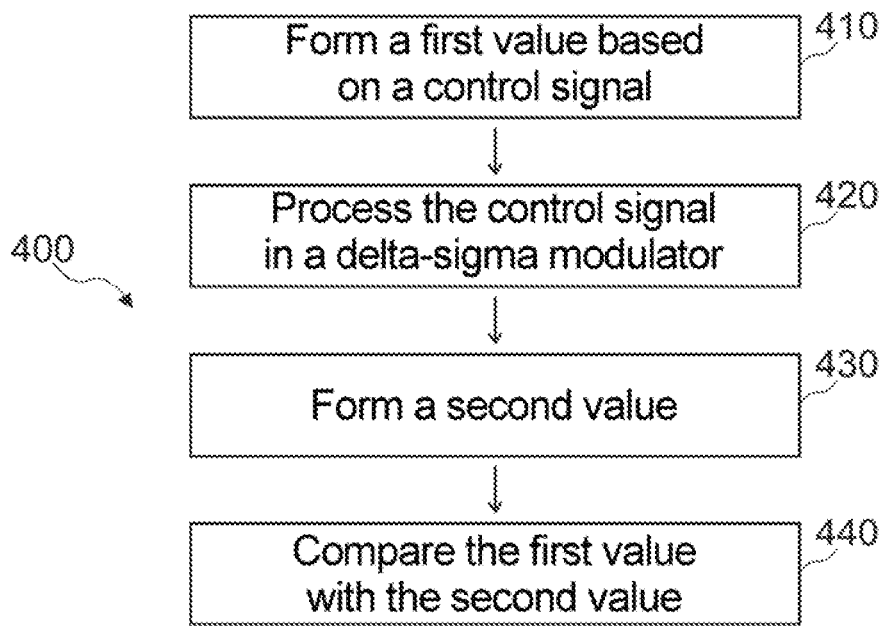
FIG. 4 shows a flowchart of a method for monitoring a signal processing circuit.

FIG. 4 shows a flowchart of a method 400 for monitoring a signal processing circuit. The method comprises forming 410 a first value based on a control signal in order to set a frequency of a control loop of an oscillator. The method furthermore comprises processing 420 the control signal in a delta-sigma modulator in order to generate a modulated signal, and forming 430 a second value based on the modulated signal. The method comprises comparing 440 the first value associated with the control signal with the second value associated with the modulated signal in order to monitor the signal processing circuit.

By way of example, in the case of a correct function of the signal processing circuit, an average value or accumulated value of the control signal (for example an input signal of the signal processing circuit) may correspond to an average value or accumulated value of the modulated signal (for example an output signal of the signal processing circuit). Comparing 440 the first and the second value makes it possible, when the values match, to detect that the signal processing circuit is functioning correctly. If the two values deviate from one another by more than a predetermined tolerance value, the tolerance range being able to range from no deviation up to any desired deviation, it may by contrast be detected that the signal processing circuit is not functioning correctly.

According to the method 400, an error information signal is output if the first value based on the control signal deviates from the second value based on the modulated signal by more than the predetermined tolerance value. It is possible for a system-related difference to exist between the compared values. The predetermined tolerance value may for example depend on a considered signal length of the control signal and a corresponding signal length of the modulated signal and/or depend on a modulation range of the delta-sigma modulator or the order of the delta-sigma modulator.

Further details and aspects are described in connection with examples explained further above or further below. The examples shown in FIG. 4 may have one or more optional additional features that correspond to one or more aspects that are described in connection with the proposed concept or one or more examples further above or further below (for example in connection with FIGS. 1-3 or FIGS. 5a-7).

Figure 5A:
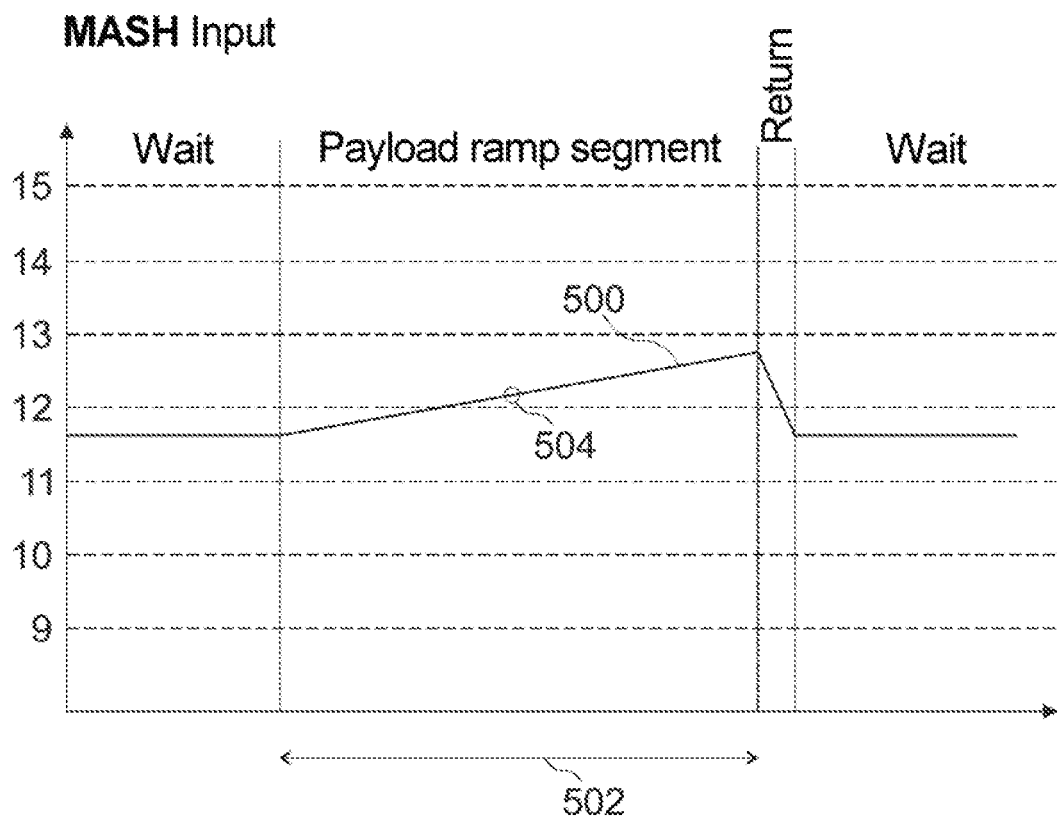
FIG. 5a shows an input signal comprising rational numbers.

FIG. 5a shows the profile of an input signal 500 that comprises rational numbers. The input signal 500 may be provided for example to a signal input of a delta-sigma modulator or of a MASH. It may be for example a control signal for generating a frequency sweep. The input signal 500 may have a ramp segment within a time period 502, by way of which a frequency modulation, e.g. a complete signal sweep, is controlled. A signal section 504 is shown within the ramp segment.

Figure 5B:
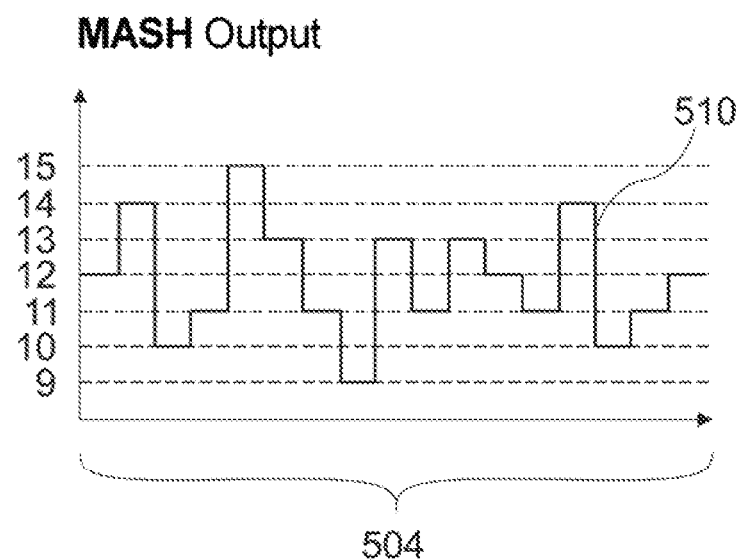
FIG. 5b shows a modulated signal comprising whole numbers.

FIG. 5b shows the profile of a modulated signal 510 that comprises whole numbers. The section of the modulated signal 510 that is shown corresponds to the signal section 504 from FIG. 5a. By way of example, the modulated signal 510 corresponds to an output signal of a sigma-delta modulator having a MASH, which is brought about by the input signal 500. FIGS. 5a and 5b thus show, by way of example, a fractional MASH input that is converted into a whole-number output. Low-pass filters of the MASH output (FIG. 5b) may lead to the same waveform that is shown in the MASH input timing diagram (FIG. 5a).

A mechanism for monitoring the digital path from the output of a ramp sequencer (signal generator) to the MMD (multi-modulus divider) input is proposed. For fractional-N PLLs, this path comprises for example multi-stage noise shaping (MASH). The conversion illustrated in FIGS. 5a and 5b is also known as a sigma-delta modulation. In addition to the property that it transforms or shifts digital noise to higher frequencies, the average of the output data stream from MASH (only whole numbers) is approximately the same as the input of the MASH (whole numbers and fractions) over time. This input/output relationship may be used to assess whether the digital circuit is operating correctly. The monitoring may be applied e.g. only to each payload data ramp segment of the ramp sequence, which may be sufficient, since only the payload data ramp segment is emitted by the transmitter antenna, e.g. a radar antenna, and is thus safety-critical.

Further details and aspects are described in connection with examples explained further above or further below. The examples shown in FIGS. 5a and 5b may have one or more optional additional features that correspond to one or more aspects that are described in connection with the proposed concept or one or more examples further above or further below (for example in connection with FIGS. 1-4 or FIGS. 6-7).

Figure 6:
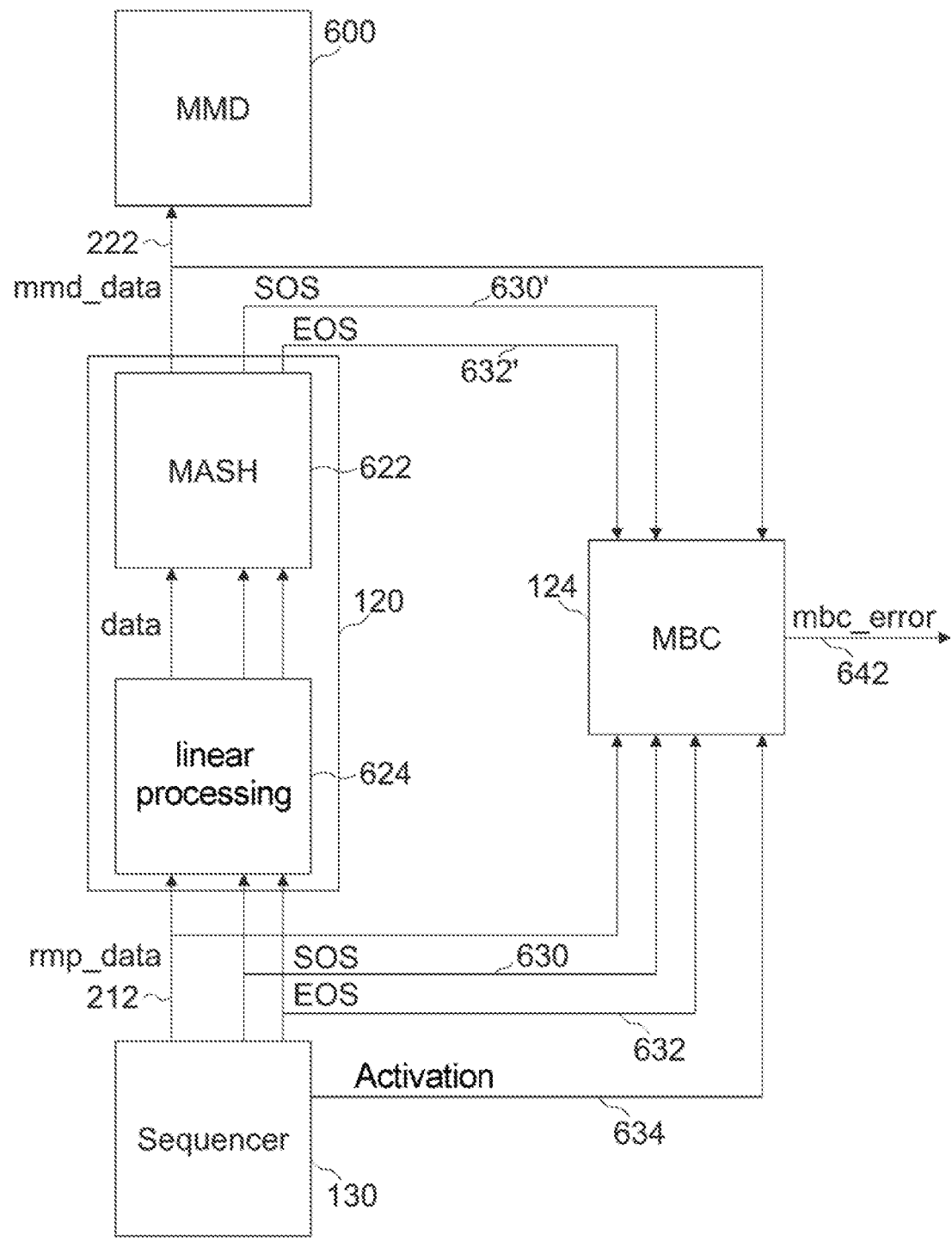
FIG. 6 shows a schematic block circuit diagram of a monitor block and of a monitored signal processing block.

FIG. 6 shows a block circuit diagram of a monitor block (MBC: modulation bandwidth check) and of a monitored signal processing block. The monitor block may correspond for example to a monitoring device or have one of these, for example to the second monitoring circuit 124. The monitored signal processing block may correspond to the delta-sigma modulator 120 or have one of these. The signal processing block may have a MASH 622 and/or a linear signal processing block 624. The output signal 222 or modulated signal 222 that is present at a signal output of the delta-sigma modulator 120 is used as input signal for a multi-modulus divider (MMD) 600. By way of example, the monitor block operates only after receiving an activation signal 634 that indicates a start of generation of control signals for ramp generation.

The payload data ramp segments may be characterized by a signal "start of segment" 630 (SOS) and a signal "end of segment" 632 (EOS). Other forms of sideband signals are also possible, e.g. a valid signal and a last signal for displaying a last sample of a dataset. The block "linear processing" is required e.g. in one specific implementation in order to prepare the sequencer output data for MASH processing. The linear block may be an asynchronous FIFO (first in first out) for cross-cycle-range data handling (for example for data rate conversion in order to produce a data rate of the output signal that is different from a data rate of the input signal)—and/or a decimation/interpolation filter (for example cascaded integrator comb filter) for sample rate conversion.

The purpose of the modulation bandwidth check (MBC) used for monitoring is that of checking the bandwidth of the ramp segment in a manner controlled by the signal generator and the signal processing device. By way of example, the distance to a radar target is measured correctly only when the bandwidth is correct.

A fundamental aspect may be comparing the average of the MASH input (sequencer output) with the average of the MASH output for each ramp segment. Since the average values may deviate from one another, a deviation (epsilon) is permissible. If epsilon is exceeded (assessed using the payload data ramp segment), a signal "mbc_error" is output for example.

The second monitoring device 124 may have a signal output. If monitoring of the delta-sigma modulator 120 reveals that this is not functioning correctly, an error signal 642 may be output via the signal output.

In addition, the synchronization of the compared data may require special care, since the sequencer data stream arrives, e.g., at the monitoring device, earlier than the modulated signal 222 (MMD data). The respective start and the respective end may be indicated by start signals 630' and stop signals 632' that correspond to the signals 630, 632.

The MBC epsilon error threshold, e.g. the predetermined tolerance value, depends for example predominantly on the MASH order and the length of the payload ramp segment. For a 3rd-order MASH, the initial value may deviate from the actual value e.g. between +4 and −3. If more values MMD_data 222 are averaged, the initial value loses significance. For the systematic error, the following applies: MBC_EPSILON=MAX_MMD_LSB_ERR/number of sample values, wherein MAX_MMD_LSB_ERR is a maximum possible deviation value. In the given example, it holds true that MAX_MMD_LSB_ERR is +4, since it is the maximum value by which the desired value may deviate. For example, a divider value (MMD_data) of 12 corresponds to a VCO output frequency of 76.8 GHz. The sigma-delta modulation for instance has the range of [9; 16] for the frequency 76.8 GHz.

The comparison thus depends for example on the sigma-delta modulation range or the modulator order of the sigma-delta modulator and/or MASH that are/is used. In other words, a greater sigma-delta modulation range may result in a higher permissible deviation value between average input signal and average output signal of the delta-sigma modulator.

Further details and aspects are described in connection with examples explained further above or further below. The examples shown in FIG. 6 may have one or more optional additional features that correspond to one or more aspects that are described in connection with the proposed concept or one or more examples further above or further below (for example in connection with FIGS. 1-5b or FIG. 7).

Figure 7:
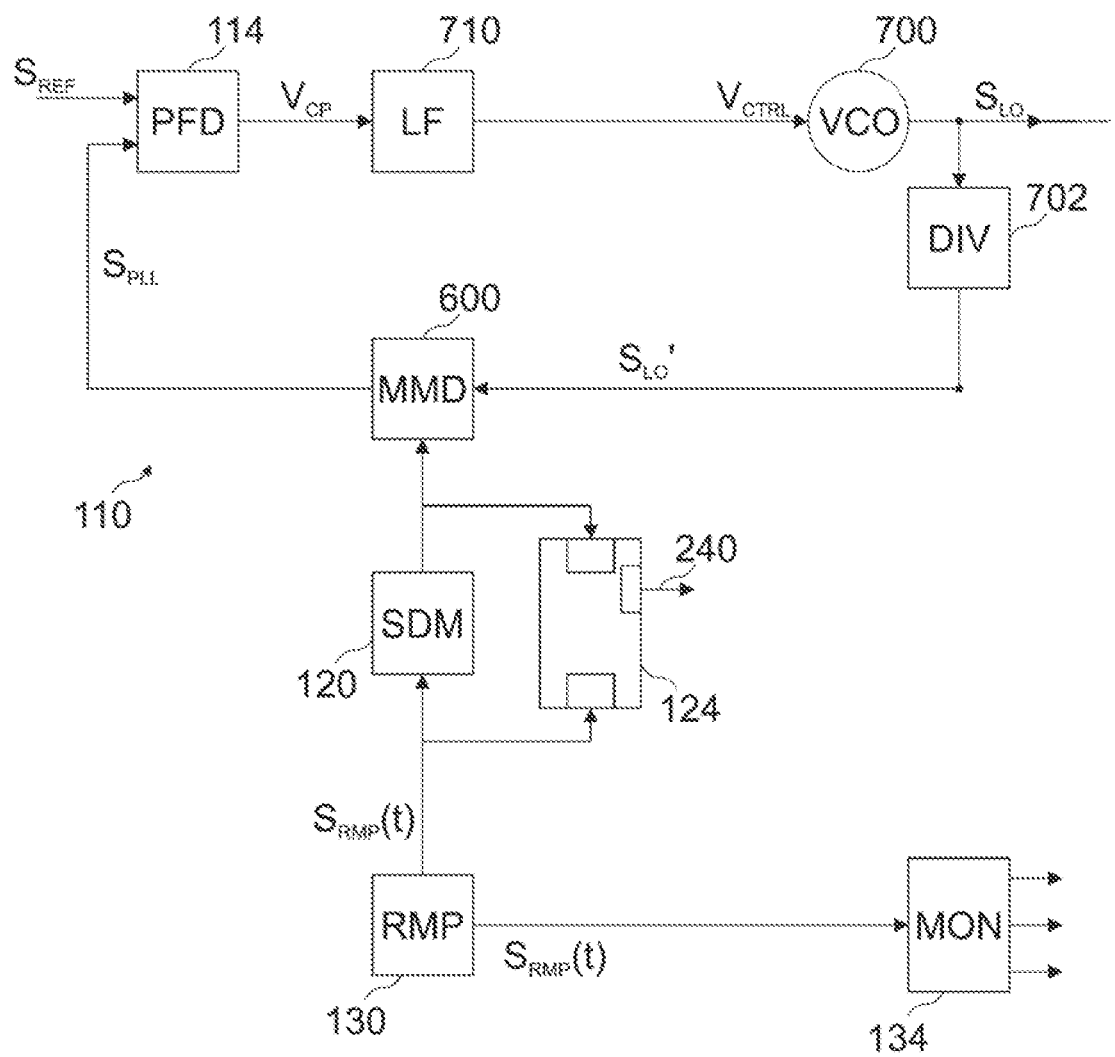
FIG. 7 shows a schematic block diagram for illustrating one example of a phase-locked loop (PLL) for generating a frequency-modulated RF signal.

FIG. 7 shows a block diagram for illustrating one example of a phase control circuit (PLL, phase-locked loop) for generating a frequency-modulated RF signal. A schematic circuit diagram is shown that depicts, by way of example, the basic structure of an oscillator or local oscillator that comprises a phase-locked loop (PLL) having a voltage-controlled oscillator (VCO) 700. In the present example, the VCO 700 generates an RF oscillator signal $s_{LO}(t)$ that may lie e.g. in the EHF band (30 GHz to 300 GHz) and that may be used for instance for a radar signal. A frequency $f_{LO}$ of the RF oscillator signal $s_{LO}(t)$ depends on an input voltage $V_{CTRL}$ (control voltage) of the VCO 700. Since the frequency $f_{LO}$ is too high for direct further processing, a frequency divider 702 having a constant division ratio 1/M is connected downstream of the VCO 700. The factor M is a whole number and may e.g. be 32. However, other values are also possible for M (e.g. 1, 2, 4, 6, 8, etc.). In the mentioned example of 1/M=1/32, an oscillator frequency $f_{LO}$ of 80 GHz would be reduced to 2.5 GHz. The factor M is constant during operation, that is to say M does not change during operation. M may nevertheless be set to a desired value depending on the configuration of the RF front-end. The frequency at the output of the frequency divider 702 is referred to as $f_{LO}'$ ($f_{LO}'=f_{LO}/M$), and the reduced-frequency oscillator signal is referred to as $s_{LO}'(t)$.

A multi-modulus divider (MMD) 600 is connected downstream of the frequency divider 702, which multi-modulus divider is designed to reduce the frequency $f_{LO}'$ of the signal $s_{LO}'(t)$ by a variable factor N. The output signal of the multi-modulus divider 600 is referred to as $s_{PLL}(t)$, and its frequency is referred to as $f_{PLL}$ ($f_{LO}'/N=f_{PLL}$). By continuously varying the division ratio 1/N of the multi-modulus divider 600 (for example by way of a delta-sigma modulator 120), a rational factor is effectively able to be brought about. In this case, a desired rational factor R is modulated e.g. by way of the delta-sigma modulator 120. An updated whole-number factor value N for the multi-modulus divider 600 is generated at the output of the delta-sigma modulator 120 in each clock cycle. On average, a rational factor N is obtained. Such frequency divider circuits (MMD and modulator) are also referred to as fractional-N dividers. The sigma-delta modulator may have e.g. a MASH structure (MASH, multi-stage noise shaping).

The output signal $s_{PLL}(t)$ of the multi-modulus divider 600 and a reference signal $s_{REF}(t)$ (frequency $f_{REF}$) are fed to a phase detector (PD) or phase frequency detector (PFD) 114 that is designed to compare the phases (or phases and frequencies) of the signals $s_{PLL}(t)$ and $s_{REF}(t)$. The output signal $V_{CP}$ of the phase frequency detector 114 depends on the detected phase and/or frequency difference. For example, the output stage of a phase frequency detector comprises a charge pump. Different implementations of phase detectors and phase frequency detectors are however known per se and are not discussed further here. The output signal $V_{CP}$ of the phase frequency detector 114 is fed to what is known as the loop filter 710 (LF). This loop filter 710 for instance determines the bandwidth of the PLL and provides the control voltage $V_{CTRL}$ for the VCO 700 at its output, as a result of which the control loop is closed. In steady state, the phases of the signals $s_{PLL}(t)$ and $S_{REF}(t)$ are "locked" (or a locked state is achieved) and the phases of the signals $s_{PLL}(t)$ and $s_{LO}(t)$ are synchronized with the phase of the reference signal $s_{REF}(t)$. The reference signal $s_{REF}(t)$ may be generated for example by way of a quartz oscillator (not illustrated) or be generated based on a quartz oscillator signal (for example by way of frequency multiplication or frequency division).

According to the proposed concepts, the phase control circuit may be monitored in terms of its functionality. By way of example, an integrity of a control signal generated by a signal generator 130 and that is used as input signal for the delta-sigma modulator 120 may be monitored by a third monitoring circuit 134. To this end, a signal $S_{RMP}(t)$ that is used as input signal of the delta-sigma modulator 120 is also transmitted to the monitoring device 134 by way of a data line. A correct functionality of the delta-sigma modulator 120 may be monitored for example by a monitoring device 124. The monitoring device 124 may be designed for example in accordance with the monitoring device 200 described above; for example, the error information signal may be output via the signal output 240 as soon as a function of the delta-sigma modulator 120 deviates from a setpoint function.

FIG. 7 thus shows an example of a phase-locked loop having three different monitoring functions. The phase-locked loop may be used for example in a radar sensor. A functional safety of the radar sensor is thereby able to be increased by improving the monitoring of the functionality of the radar sensor.

Further details and aspects are described in connection with examples explained further above or further below. The examples shown in FIG. 7 may have one or more optional additional features that correspond to one or more aspects that are described in connection with the proposed concept or one or more examples further above or further below (for example in connection with FIGS. 1-6).

Aspects of the application relate to monitoring of a generator for generating factor values (e.g. MASH) for a multi-modulus divider of a PLL circuit for fractionally rational clock generation (fractional-N PLL).

Functional safety may be an essential feature in FMCW radar sensors, for example in order to meet a standard specification (for example in accordance with ISO 26262). Proposed concepts disclose a method for monitoring the digital path from a sequencer/a ramp generator to the multi-modulus divider of a fractional-N PLL. The concepts may be used to check whether a desired FMCW bandwidth (for example a setpoint bandwidth) has been executed.

Some radar sensors have only for example digital lock detectors (and analog lock detectors) that indicate for example whether a particular phase of the PLL has been achieved (for example, whether a locked state of the PLL has been achieved). As a result, a frequency shift brought about by errors in the digital logic to the multi-modulus divider may not be detected, for example.

For example, radar components that implement proposed methods may require interaction when integrated into a system. For example, in a case in which a monitoring device indicates an error, there may be a predefined response.

Proposed concepts relate e.g. to monitoring the digital path from a signal output of a ramp generator to a signal input of a multi-modulus divider (which may represent for example an end of a digital path in a PLL of a radar, for instance before analog signal processing begins) by comparing the path inputs with path outputs in terms of their average values.

Using proposed concepts, it is possible for example to provide radar sensors that satisfy requirements of an ASIL C-classification.

Monitoring may e.g. be provided by monitoring an output of the delta-sigma modulator (or of the MASH) by way of a cyclic redundancy check (CRC). A MASH may have internal feedback structures of a digital path, which may lead to pseudorandom output signal behavior. To calculate a reference checksum, it may be the case that initial states of the system and subsequent values for each clock time have to be known. Resetting the MASH may force the system into a known initial state, but this may possibly not be an alternative as the PLL would thereby be put into a state outside of a locked state. A monitoring device (e.g. MBC) may require correct input data made available by the sequencer, which is able to be checked for example by way of a cyclic redundancy check.

The aspects and features which are described together with one or more of the previously detailed examples and figures may also be combined with one or more of the other examples in order to replace an identical feature of the other example or in order to additionally introduce the feature in the other example.

Examples may furthermore be a computer program with a program code for executing one or more of the above methods or may relate thereto when the computer program is executed on a computer or a processor. Steps, operations or processes of different methods described above may be executed by programmed computers or processors. Examples may also cover program storage devices, e.g. digital data storage media, which are machine-readable, processor-readable or computer-readable, and code machine-executable, processor-executable or computer-executable programs of instructions. The instructions execute some or all of the steps of the above-described methods or bring about the execution thereof. The program storage devices may comprise or be e.g. digital memories, magnetic storage media such as for example magnetic disks and magnetic tapes, hard disk drives or optically readable digital data storage media. Further examples may also cover computers, processors or control units that are programmed to execute the steps of the above-described methods, or (field) programmable logic arrays ((F)PLAs) or (field) programmable gate arrays ((F)PGAs) that are programmed to execute the steps of the above-described methods.

Only the principles of the disclosure are illustrated by the description and drawings. Furthermore, all examples mentioned here are expressly intended in principle to serve only for illustrative purposes, so as to support the reader in understanding the principles of the disclosure and the concepts provided by the inventor(s) for further refining the technology. All statements made here relating to principles, aspects and examples of the disclosure and concrete examples thereof comprise the counterparts thereof.

A function block designated as "means for . . ." executing a specific function may relate to a circuit designed to execute a specific function. Consequently a "means for something" may be implemented as a "means designed for or suitable for something", e.g. a component or a circuit designed for or suitable for the respective task.

Functions of different elements shown in the figures including those function blocks designated as "means", "means for providing a signal", "means for generating a signal", etc. may be implemented in the form of dedicated hardware, e.g. "a signal provider", "a signal processing unit", "a processor", "a controller" etc., and as hardware capable of executing software in conjunction with associated software. When provided by a processor, the functions may be provided by a single dedicated processor, by a single jointly used processor or by a plurality of individual processors, some or all of which are able to be used jointly. However, the term "processor" or "controller" is far from being limited to hardware capable exclusively of executing software, but rather may encompass digital signal processor hardware (DSP hardware), network processor, application-specific integrated circuit (ASIC), field-programmable logic array (FPGA=Field Programmable Gate Array), read-only memory (ROM) for storing software, random access memory (RAM) and non-volatile storage device (storage). Other hardware, conventional and/or customized, may also be included.

A block diagram may illustrate for example a rough circuit diagram that implements the principles of the disclosure. In a similar manner, a flowchart, a flow diagram, a state transition diagram, a pseudo-code and the like may represent various processes, operations or steps that are represented for example substantially in a computer-readable medium and are thus executed by a computer or processor, regardless of whether such a computer or processor is explicitly shown. Methods disclosed in the description or in the patent claims may be implemented by a component having a means for executing each of the respective steps of these methods.

It is to be understood that the disclosure of a plurality of steps, processes, operations or functions disclosed in the description or the claims should not be interpreted as being in the specific order, unless this is explicitly or implicitly indicated otherwise, e.g. for technical reasons. The disclosure of a plurality of steps or functions therefore does not limit them to a specific order, unless these steps or functions are not interchangeable for technical reasons. Furthermore, in some examples, an individual step, function, process or operation may include a plurality of partial steps, functions, processes or operations and/or be subdivided into them. Such partial steps may be included and be part of the disclosure of this individual step, provided that they are not explicitly excluded.

Furthermore, the claims that follow are hereby incorporated in the detailed description, where each claim may be representative of a separate example by itself. While each claim may be representative of a separate example by itself, it should be taken into consideration that—although a dependent claim may refer in the claims to a specific combination with one or more other claims—other examples may also encompass a combination of the dependent claim with the subject matter of any other dependent or independent claim. Such combinations are explicitly proposed here, provided that no indication is given that a specific combination is not intended. Furthermore, features of a claim are also intended to be included for any other independent claim, even if this claim is not made directly dependent on the independent claim.

What is claimed is:

1. A radar device, comprising:
a phase-locked loop configured to generate a radio frequency signal, wherein the phase-locked loop includes a multi-modulus divider;
a delta-sigma modulator configured to generate a modulated signal for the multi-modulus divider;
a signal generator configured to generate an input signal for the delta-sigma modulator;
a first monitoring circuit configured to monitor a locked state of the phase-locked loop;
a second monitoring circuit configured to monitor the delta-sigma modulator; and
a third monitoring circuit configured to monitor the signal generator.

2. The radar device as claimed in claim 1, wherein the first monitoring circuit implements a first monitoring method, the second monitoring circuit implements a second monitoring method different from the first monitoring method, and the third monitoring circuit implements a third monitoring method different from the first monitoring method and the second monitoring method.

3. The radar device as claimed in claim 1, wherein the first monitoring circuit is configured to output first information that indicates an out-of-lock state of the phase-locked loop, wherein the second monitoring circuit is configured to output second information that indicates an incorrect behavior of the delta-sigma modulator, and wherein the third monitoring circuit is configured to output third information that indicates an incorrect behavior of the signal generator.

4. The radar device as claimed in claim 1, wherein the third monitoring circuit is configured to use hash values to monitor the signal generator.

5. The radar device as claimed in claim 1, wherein the second monitoring circuit is configured to use a comparison between an input signal and an output signal of the delta-sigma modulator to monitor the delta-sigma modulator.

6. The radar device as claimed in claim 1, wherein the first monitoring device comprises:
a first counter that is configured to count output signals of the multi-modulus divider to generate a first count value; and
a second counter that is configured to count output signals of a reference clock to generate a second count value, wherein the first monitoring device is configured to compare the first count value with the second count value.

7. The radar device as claimed in claim 1, wherein the first, the second, and the third monitoring devices are configured to output a respective error information signal in a case of detecting an incorrect functionality of the phase-locked loop, the delta-sigma modulator, and the signal generator, respectively.

8. A monitoring device configured to monitor a functionality of a signal processing circuit, the monitoring device comprising:
a first signal input configured to receive an output signal of a signal generator;
a second signal input configured to receive a modulated signal generated by a delta-sigma modulator in the signal processing circuit, wherein the delta-sigma modulated signal is based on the output signal of the signal generator; and
a comparison circuit that is configured to receive the output signal of the signal generator and the modulated signal and compare the modulated signal with the output signal in order to monitor a correct signal generation of the delta-sigma modulator based on a comparison result, wherein the output signal of the signal generator is a sequence of digital signals that represent successively incremented rational numbers, and wherein the modulated signal comprises a sequence of natural numbers generated based on the sequence of digital signals.

9. The monitoring device as claimed in claim 8, wherein the monitoring device is configured to generate a comparison value for monitoring the delta-sigma modulator based on data received by the first signal input and based on data received by the second signal input.

10. The monitoring device as claimed in claim 9, further comprising:
a signal output, wherein the monitoring device is configured to output an error information signal via the signal output if the comparison value lies outside of a predetermined tolerance range.

11. The monitoring device as claimed in claim 8, wherein the output signal of the signal generator is a sequence of digital signals for controlling a frequency ramp.

12. The monitoring device as claimed in claim 11,
wherein the sequence of digital signals comprises rational numbers, including whole numbers and fractions, and
wherein the modulated signal comprises a sequence of natural numbers.

13. The monitoring device as claimed in claim 8, wherein the modulated signal is an input signal for a multi-modulus divider of a phase-locked loop of a radar sensor.

14. The monitoring device as claimed in claim 8, wherein an average value or an accumulated value of the sequence of natural numbers is equal to an average value or an accumulated value of the successively incremented rational numbers, respectively, in the absence of a fault.

15. The monitoring device as claimed in claim 8, wherein the modulated signal is configured to control a division ratio of a frequency divider.

16. A monitoring device configured to monitor a functionality of a signal processing circuit, the monitoring device comprising:
a first signal input configured to receive an output signal of a signal generator;
a second signal input configured to receive a modulated signal generated using a delta-sigma modulator in the signal processing circuit, wherein the modulated signal is based on the output signal of the signal generator; and
a comparison circuit that is configured to monitor a correct signal generation of the signal processing circuit based on the output signal of the signal generator and the modulated signal,
wherein the monitoring device is configured to generate a comparison value for monitoring the signal processing circuit based on data received by the first signal input and based on data received by the second signal input,
wherein the output signal of the signal generator is a sequence of digital signals for controlling a frequency ramp, and
wherein the monitoring device is configured to generate the comparison value based on values of the sequence of digital signals in order to control the frequency ramp within a time interval between a first digital signal and a second digital signal, wherein the first digital signal controls a beginning of the frequency ramp and the second digital signal controls an end of the frequency ramp.

17. A phase control circuit, comprising:
a signal generator configured to generate an output signal;
a signal processing circuit comprising a delta-sigma modulator configured to generate a modulated signal based on the output signal; and
a monitoring device configured to monitor a functionality of the signal processing circuit, the monitoring device comprising:
a first signal input configured to receive the output signal of the signal generator;
a second signal input configured to receive the modulated signal generated by the delta-sigma modulator; and
a comparison circuit that is configured to receive the output signal of the signal generator and the modulated signal and monitor a correct signal generation of the signal processing circuit based on a comparison of the output signal of the signal generator and the modulated signal,
wherein a signal output of the signal generator from which the output signal is output is connected to the first signal input of the monitoring device and to an input of the signal processing circuit, and
wherein a signal output of the signal processing circuit from which the modulated signal is output is connected to the second signal input of the monitoring device.

18. The phase control circuit as claimed in claim 17, further comprising:
a supervision circuit that is configured to monitor at least one of:
an integrity of a sequence of digital signals of the signal generator in order to control a frequency ramp based on test values created using the sequence of digital signals, or
a phase of an output signal of a multi-modulus divider of a phase-locked loop of a radar sensor.

19. The phase control circuit as claimed in claim 18, wherein the supervision circuit comprises a lock detector.

20. The phase control circuit as claimed in claim 17, wherein the input of the signal processing circuit is an input of the delta-sigma modulator.

21. The phase control circuit as claimed in claim 17, wherein:
the output signal of the signal generator is a sequence of digital signals comprising rational numbers that include whole numbers and fractions,
the modulated signal comprises a sequence of natural numbers generated based on the sequence of digital signals,
the delta-sigma modulator is configured to convert the fractions into natural numbers to generate the sequence of natural numbers of the modulated signal.

22. A radar sensor, comprising:
a controllable oscillator; and
a phase control circuit configured to control a frequency generation of a radar signal by way of the controllable oscillator, the phase control circuit comprising:
a signal generator configured to generate an output signal;
a signal processing circuit comprising a delta-sigma modulator configured to generate a modulated signal based on the output signal; and a monitoring device configured to monitor a functionality of the signal processing circuit, the monitoring device comprising:
a first signal input configured to receive the output signal of the signal generator;
a second signal input configured to receive the modulated signal generated by the delta-sigma modulator; and
a comparison circuit that is configured to receive the output signal of the signal generator and the modulated signal and monitor a correct signal generation of the signal processing circuit based on a comparison of the output signal of the signal generator and the modulated signal,
wherein a signal output of the signal generator from which the output signal is output is connected to the first signal input of the monitoring device and to an input of the signal processing circuit, and
wherein a signal output of the signal processing circuit from which the modulated signal is output is connected to the second signal input of the monitoring device.

23. The radar sensor as claimed in claim 22, further comprising:
a phase-locked loop configured to generate a radio frequency signal, wherein the phase-locked loop includes a multi-modulus divider,
wherein the multi-modulus divider is arranged in a feedback path of the controllable oscillator, wherein the signal processing circuit and the monitoring device are arranged outside of the feedback path of the controllable oscillator.

24. A method for monitoring a signal processing circuit, the method comprising:
calculating a first value based on a control signal in order to set a frequency of a control loop of an oscillator;
processing the control signal in a delta-sigma modulator in order to generate a modulated signal output by the delta-sigma modulator;
calculating a second value based on the modulated signal; and
comparing the modulated signal with the control signal, including comparing the first value associated with the control signal with the second value associated with the modulated signal in order to monitor the signal processing circuit based on a comparison result of the first value and the second value.

25. The method as claimed in claim 24, wherein:
the output signal of the signal generator is a sequence of digital signals that represent successively incremented rational numbers,
the modulated signal comprises a sequence of natural numbers generated based on the sequence of digital signals,
the first value is a function of the successively incremented rational numbers, and
the second value is a function of the sequence of natural numbers.

26. The method as claimed in claim 25, wherein:
the first value is an average value or an accumulated value of the successively incremented rational numbers, and
the second value is an average value or an accumulated value of the sequence of natural numbers.

27. The method as claimed in claim 25, wherein the output signal is a ramp signal formed by the sequence of digital signals and the successively incremented rational numbers include whole numbers and fractions.

* * * * *